(12) United States Patent
Taylor

(10) Patent No.: US 8,282,451 B2
(45) Date of Patent: Oct. 9, 2012

(54) PLENUM PARTITION BAFFLE SYSTEM

(75) Inventor: Laurie Taylor, Ballwin, MO (US)

(73) Assignee: CompuSpace LC, Chesterfield, MO (US)

( * ) Notice: Subject to any disclaimer, the term of this patent is extended or adjusted under 35 U.S.C. 154(b) by 114 days.

(21) Appl. No.: 12/540,264

(22) Filed: Aug. 12, 2009

(65) Prior Publication Data

US 2010/0035535 A1    Feb. 11, 2010

Related U.S. Application Data

(63) Continuation of application No. 11/518,976, filed on Sep. 11, 2006, now abandoned.

(60) Provisional application No. 60/790,883, filed on Apr. 11, 2006.

(51) Int. Cl.
*F24F 7/007*    (2006.01)
*F24F 13/10*    (2006.01)
*E04B 2/82*    (2006.01)

(52) U.S. Cl. .................. 454/186; 236/49.5; 52/263

(58) Field of Classification Search .............. 454/186
See application file for complete search history.

(56) References Cited

U.S. PATENT DOCUMENTS

| | | | |
|---|---|---|---|
| 2,352,876 A | 7/1944 | Wilson |
| 2,353,876 A | 7/1944 | Cawein |
| 2,551,751 A | 5/1951 | MacDougall, Jr. |
| 2,595,408 A | 5/1952 | Quest |
| 2,868,943 A | 1/1959 | Steele |
| 2,887,733 A | 5/1959 | Kice |
| 3,078,880 A | 2/1963 | Stephens |
| 3,626,837 A | 12/1971 | Pelosi, Jr. et al. |
| 3,747,503 A | 7/1973 | Lovell |
| 3,759,159 A | 9/1973 | Rachlin et al. |
| 3,972,272 A | 8/1976 | Bagby |
| 4,023,372 A | 5/1977 | Presler et al. |
| 4,103,598 A | 8/1978 | Cooper |
| 4,425,839 A | 1/1984 | Stull |
| 4,446,661 A | 5/1984 | Jonsson et al. |
| 4,633,766 A | 1/1987 | Nation et al. |
| 5,049,700 A * | 9/1991 | Kobayashi et al. ........... 174/482 |
| 5,271,585 A | 12/1993 | Zetena, Jr. |
| 5,316,244 A | 5/1994 | Zetena, Jr. |
| 5,341,612 A | 8/1994 | Robbins |
| 5,788,414 A | 8/1998 | Gordon |
| 5,971,507 A | 10/1999 | Peroni |
| 6,101,768 A | 8/2000 | Springstead et al. |

(Continued)

FOREIGN PATENT DOCUMENTS

WO    2007/117714    10/2007

(Continued)

OTHER PUBLICATIONS

"Sub-Zero Partitions,"; www.wdminc.com/products/productdetails.php?prodID=579; 1 page.

(Continued)

*Primary Examiner* — Steven B McAllister
*Assistant Examiner* — Helena Kosanovic
(74) *Attorney, Agent, or Firm* — Bryan Cave LLP

(57) ABSTRACT

A system for directing airflow within a plenum comprising sizeable, shapeable, and interconnectable baffles that can be nondestructively attached to plenum support structures. The system includes means for removably interconnecting the baffles and also for removably and non-destructively attaching the baffles to plenum support structure without tools.

15 Claims, 16 Drawing Sheets

U.S. PATENT DOCUMENTS

| | | |
|---|---|---|
| 6,102,501 A | 8/2000 | Chen et al. |
| 6,123,438 A | 9/2000 | Hentz |
| 6,318,113 B1 | 11/2001 | Levy et al. |
| 6,346,040 B1 | 2/2002 | Best |
| 6,347,991 B1 | 2/2002 | Bogrett et al. |
| 6,361,432 B1 | 3/2002 | Walker |
| 6,362,955 B2 | 3/2002 | Felcman et al. |
| 6,367,181 B1 * | 4/2002 | Skoog .............................. 40/591 |
| 6,601,352 B1 | 8/2003 | Obermeyer et al. |
| 6,604,993 B1 | 8/2003 | Boniface |
| 6,616,524 B2 | 9/2003 | Storck, Jr. et al. |
| 6,672,955 B2 | 1/2004 | Charron |
| 6,758,353 B2 | 7/2004 | Orr |
| 6,822,859 B2 | 11/2004 | Coglitore et al. |
| 6,837,787 B2 | 1/2005 | Crook |
| 6,854,659 B2 | 2/2005 | Stahl et al. |
| 6,862,179 B2 | 3/2005 | Beitelmal et al. |
| 7,165,363 B2 | 1/2007 | Headrick, II et al. |
| 7,214,131 B2 | 5/2007 | Malone |
| 7,266,964 B2 | 9/2007 | Vogel et al. |
| 2004/0088928 A1 * | 5/2004 | Headrick et al. .................. 52/98 |
| 2005/0072072 A1 | 4/2005 | Duncan et al. |
| 2005/0159099 A1 * | 7/2005 | Malone ......................... 454/186 |
| 2006/0081545 A1 | 4/2006 | Rassmussen et al. |
| 2006/0117686 A1 | 6/2006 | Mankell et al. |
| 2006/0213961 A1 * | 9/2006 | Cunill ...................... 229/125.37 |
| 2007/0151177 A1 | 7/2007 | Mumaw et al. |
| 2009/0059486 A1 | 3/2009 | Taylor |

FOREIGN PATENT DOCUMENTS

| | | |
|---|---|---|
| WO | 2009/025838 | 2/2009 |

OTHER PUBLICATIONS

International Search Report for PCT/US07/08974 dated Sep. 30, 2008, 2 pages.

Written Opinion of the International Searching Authority for PCT/US07/08974 dated Sep. 30, 2008, 10 pages.

* cited by examiner

FIG 4

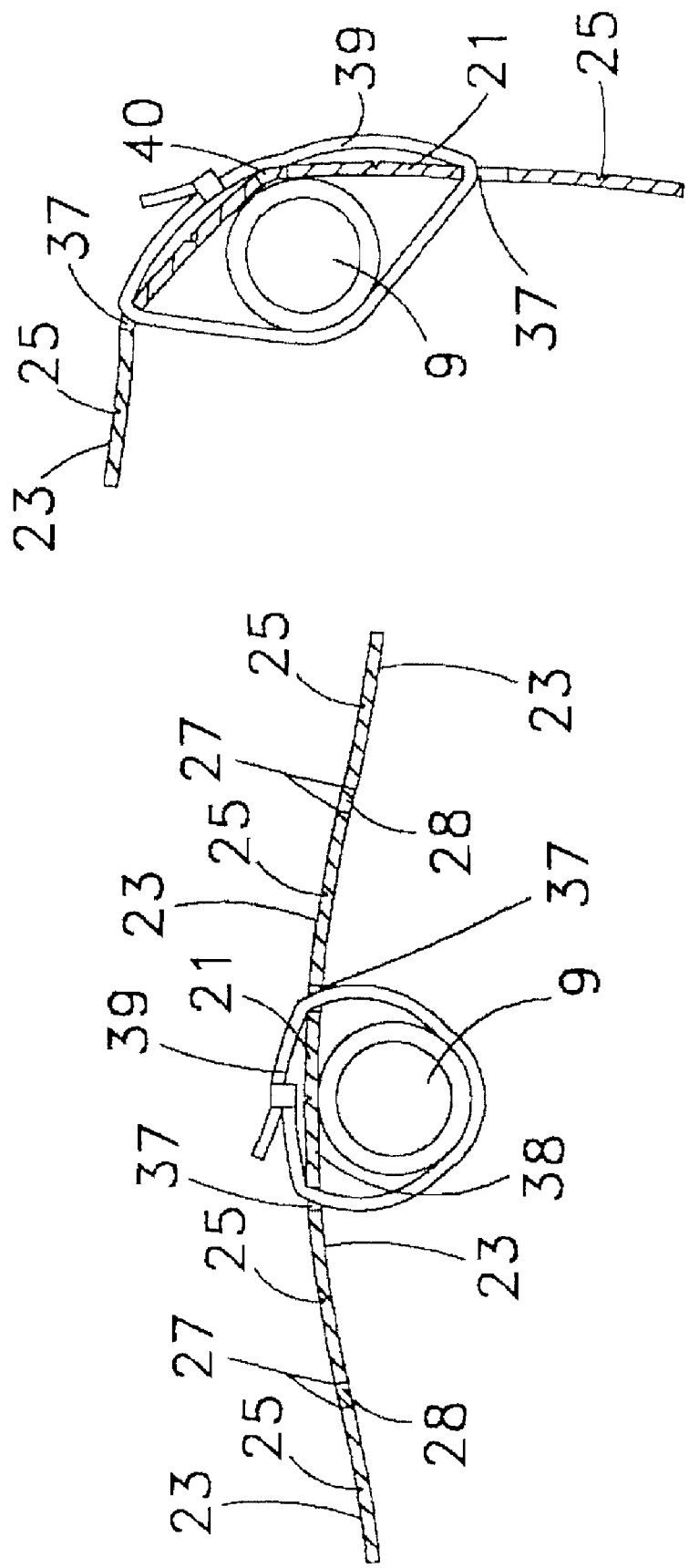

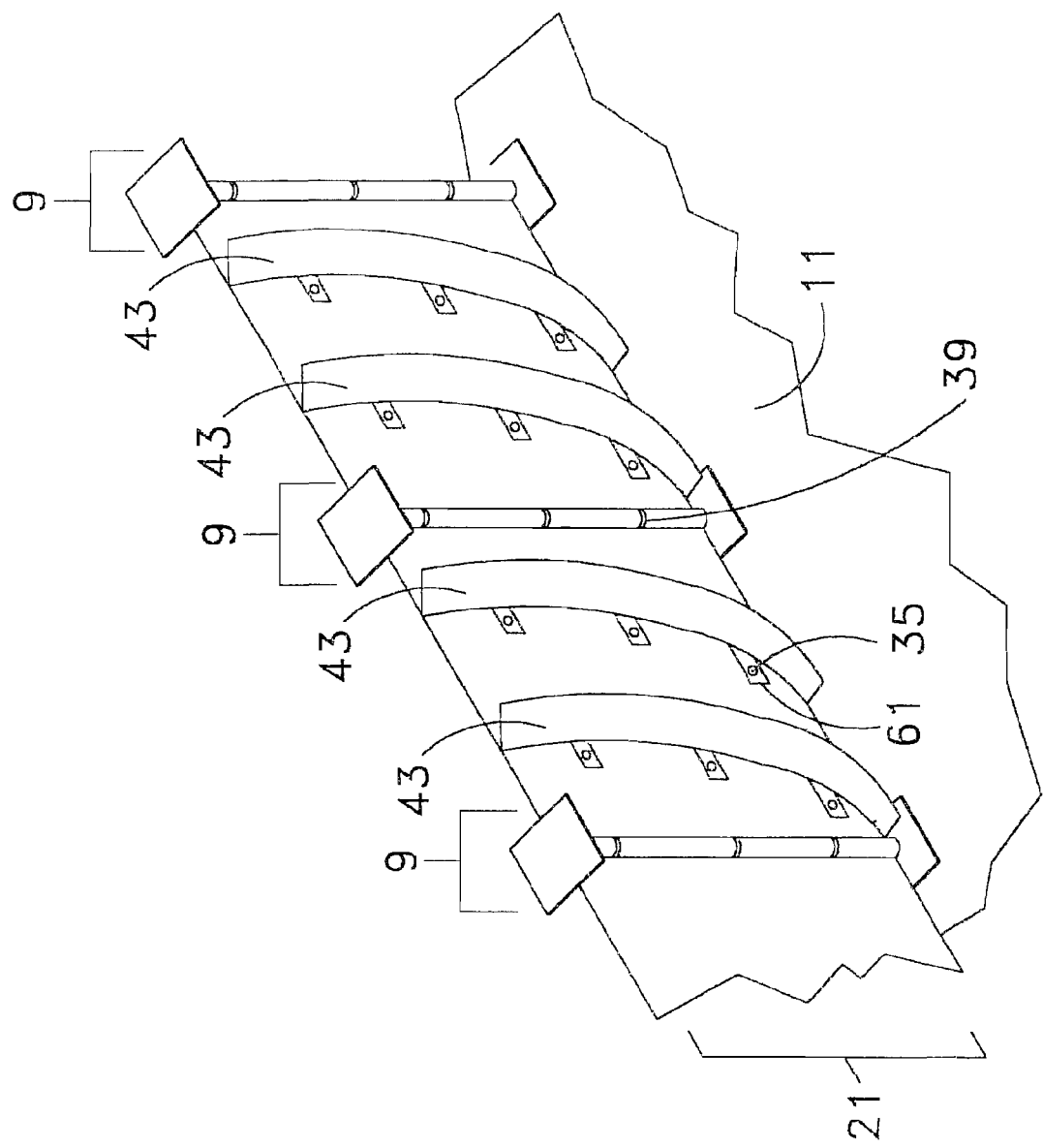

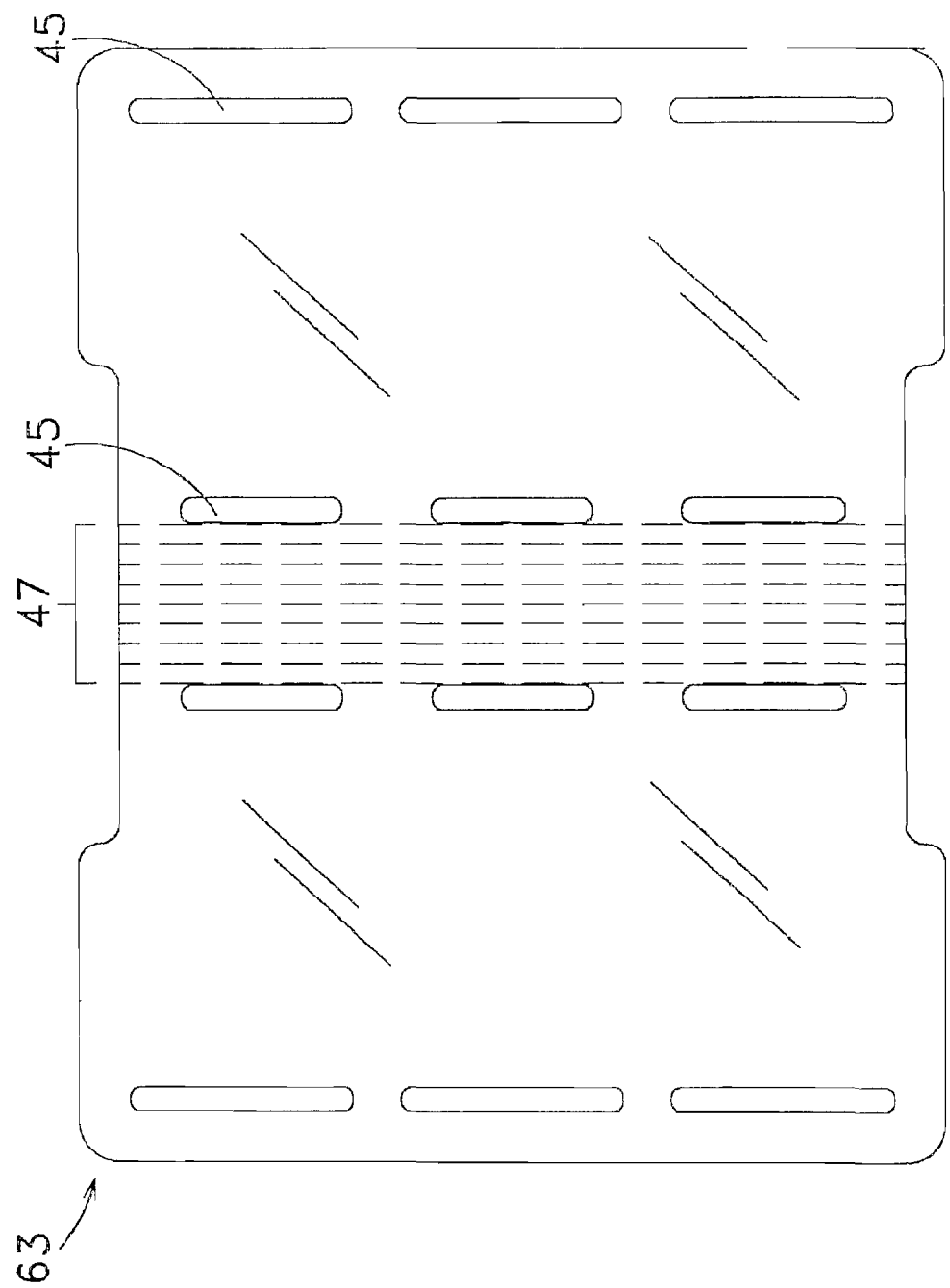

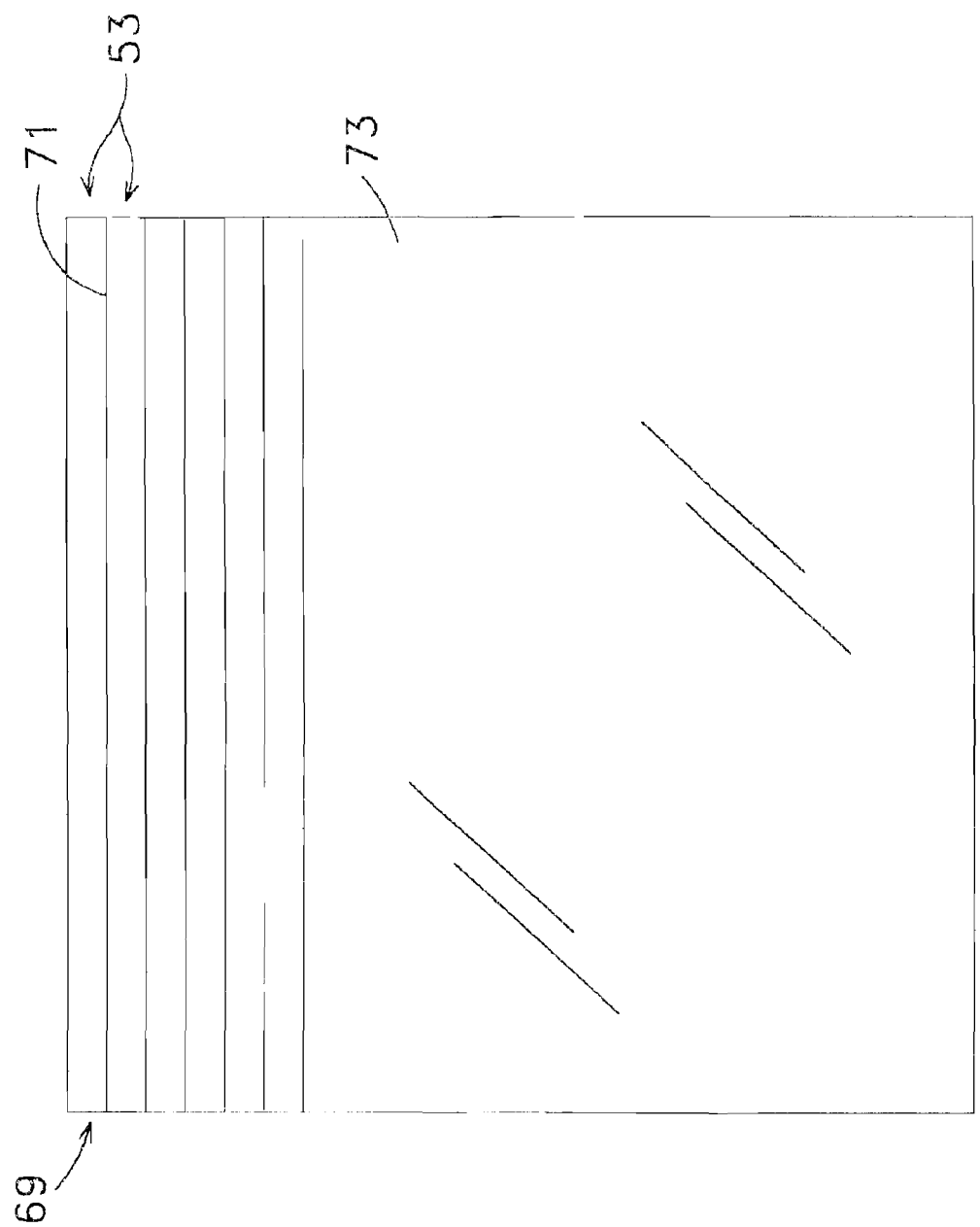

PLENUM PARTITION BAFFLE SYSTEM

CROSS REFERENCE TO RELATED APPLICATION

This application is a continuation of U.S. application Ser. No. 11/518,976 filed Sep. 11, 2006 now abandoned, claims the benefit of U.S. Provisional Application No. 60/790,883, filed on Apr. 11, 2006, both of which are hereby incorporated by reference in their entirety.

STATEMENT REGARDING FEDERALLY SPONSORED RESEARCH OR DEVELOPMENT

Not applicable.

SEQUENCE LISTING, TABLE OR COMPUTER PROGRAM ON COMPACT DISC

Not applicable.

FIELD OF INVENTION

This invention relates generally to a system that directs airflow. More specifically, it relates to an assembly of baffles that directs airflow in a plenum, and a method of using same.

BACKGROUND OF THE INVENTION

Underfloor air distribution (UFAD) is a method of delivering conditioned air inside offices and commercial buildings. UFAD is an alternative to ceiling-based heating, ventilation and air-conditioning (HVAC) methods. The open space between the sub-floor (usually a structural concrete slab) and the underside of a raised access floor is called the plenum or air handling space. UFAD systems use the plenum to deliver conditioned air into the occupied zones of the building. In a typical UFAD system, conditioned air is emitted by an air-handling unit (AHU), through the plenum and into workspaces via a variety of supply outlets (diffusers) or perforated floor tiles. The AHU is typically located in the plenum or is connected to the plenum via a minimum amount of ductwork. These supply outlets are usually located at floor level (most common), or as part of the furniture and partitions.

The underfloor plenum is formed by installation of a raised floor system. Usually this raised floor system consists of floor panels supported on pedestals and positioned above the concrete structural slab of the building. The conditioned air, being pressurized vis-à-vis the air above the plenum, typically flows freely in the plenum to the supply outlets or perforated tiles. The plenum thus provides a path for cooled air to travel from the AHU to the workspace. Access to the plenum can be achieved simply by removing one or more floor panels.

Equipment and data centers are also cooled using the plenum or underfloor air handling space. UFAD systems are particularly advantageous in light of the thermal cooling requirements of computer equipment and data centers. In fact, raised floors were developed in the 1950's and 1960's to facilitate the use and operation of mainframe computers, which required bottom air intake. However, equipment needs have changed in data centers over the past forty years, and servers and other equipment have replaced mainframes in the data center. The servers that have virtually replaced the mainframes can generate more heat than the mainframes in a more concentrated space. Current servers may produce up to six times more heat than the equipment they replace. Hence, data centers have greater cooling requirements than ever before.

Controlling high temperatures within data centers is very difficult and complex. Yet, keeping computers and data center equipment at the right temperature is critical for the life of the equipment. Such electronic equipment must be maintained in appropriate temperature environments subject to regulated rates of temperature change in order to maintain equipment reliability, abide electronic equipment warranty provisions and ascertain optimum energy usage. Achieving these requirements is an ever constant and evolving concern for the HVAC or IT professional due to the fact that computer and data processing equipment trend toward increasing the amount of power usage, and thus thermal output and cooling demand, over available space. Server manufacturers have used high output fans and enclosed chiller lines to control the high temperatures within data centers.

Another method of cooling electronic equipment environments and thus meet the thermal demands of computer equipment involves using a dedicated Computer Room Air Conditioner (CRAC) in association with a UFAD system. Electronic equipment, including computer systems, can be cooled using a pressurized plenum under a raised floor. Powerful fans in the CRAC units draw in hot air exhausted by equipment in a data center. In a conventional CRAC arrangement, fans cool the hot air by forcing it through a liquid-to-air heat exchanger. With a CRAC-UFAD system, pressurized cooling air enters the plenum beneath the raised floor of a data center. Cooled air exits from conventional CRACs at a very high velocity. However, air velocities are low and constant after the air has traveled away from the CRAC a certain distance. The plenum provides a path for cooled air to travel from the CRAC to the data center. Cooled air is distributed to the equipment in the room by placing supply outlets in the form of floor tiles with perforations in close proximity to the cool air inlet vents of the equipment.

The plenum of today's building must now house building components and infrastructure beyond HVAC apparatus. By combining a building's HVAC system with its power, voice, and data cabling into the under floor plenum, significant improvements can be realized in terms of increased flexibility and reduced costs associated with reconfiguring building services. Consequently, under-floor systems, including UFAD systems, have become desirable in view of the fact that office buildings today have high office space reconfiguration rates resulting from tenant turnover and from the extensive and ever-changing information technology infrastructure and needs of business.

When cabling runways, copper and fiber distribution and power feeds for servers share plenum space with pressurized air, plenum airflow distribution becomes less predictable. Because rigid building structural members often define the lateral confines of the plenum, the configuration of a plenum cannot easily change to meet airflow demands. This is particularly a concern when dealing with a data center that was built many years ago, and has not been upgraded to meet current standards. Airflow is generally calculated to provide for sufficient cooling in newly constructed or recently updated data centers. Based upon such airflow calculations and measurements, perforated floor tiles and CRAC blower speeds are adjusted to achieve a desired airflow rate. However, after thermal demands are calculated and cooling parameters set, airflow rates are often unintentionally changed. Airflow rates often decrease due to the addition of cables and other items within the plenum. Modifications, such as holes, in the plenum can also cause drastic changes to the airflow rates by creating a low-resistance bypass for the high-pressure cooling air. Conditions and modifications within the plenum space and imprecise calculations and measurements often produce undesirable airflow distribution through the perforated floor tiles, which could, in turn, harm electronic equipment. There is thus a need in the art for a system that can direct airflow within a plenum and which can be easily installed, modified and removed.

SUMMARY OF THE INVENTION

The present invention meets the need in the art by providing for plenum partition baffle system that non-destructively mounts to the existing plenum support structures. The system is adjustable in height and width. The system comprises an assembly of interconnectable flexible baffle panels ("baffles"). Each baffle has a first and second surface. In the preferred embodiment at least one surface of the baffle includes a scored grid pattern that divides the baffle into segments. The terms "scored" or "scoring" as used in this patent application are defined to include marks or lines created upon a surface by way of scoring, press-cutting, etching or any other technique that produces surface marks via the incomplete cutting or removal of material. The elemental shape of the scored grid is preferably rectangular, but may be any regular shape including, but not limited to, a polygon, a circle, an ellipse or an oval. The grid pattern may even comprise varying and irregular shapes. The scored segments allow the baffle to be sized and shaped simply by breaking apart or tearing off segments of the baffle along the scored grid lines. The baffle can thus be sized and shaped on-site with or without tools. By virtue of its removably segmented construction, cable, ductwork and other building infrastructure inside the plenum may be routed through the baffle anywhere in the system and including directly to the applicable equipment.

In the preferred embodiment, each scored rectangle (the elemental shape) contains an additional scored aperture outline generally centered within it and which in the preferred embodiment is racetrack or oval shaped. The areas of the baffle within the scored aperture outlines constitute "pop-out sections." These pop-out sections may be removed by hand from the baffle by application of pressure applied upon the area of the baffle within the aperture outline. In the preferred embodiment, the pressure necessary to remove the pop-out section is finger pressure. Alternatively, the pop-out section can be pressed out with a tool or can be cut out by drawing a knife-edge or sharp tool along the scored outline. Once the pop-out section is removed, a fastener-accepting aperture results in the baffle. These apertures provide means by which each baffle may be interconnected with another baffle to create a longer or larger array of baffles. The resulting apertures also allow any baffle to be mounted, without tools, to the floor pedestals supporting the raised floor and without destructive attachments to either the floor pedestals or any intra-plenum structures.

By virtue of its interconnection feature and its non-destructive mounting feature, the baffle system can be easily reconfigured as cooling needs change. Data center in-house personnel can install the system to direct airflow from the CRAC units to areas where it is needed most. The adjustable and flexible nature of the system also allows the system to be installed in plenums that vary widely in dimensions such as in the height of the raised floor above the sub-floor.

When installed, the system directs airflow from CRAC units to equipment within the data center. The system can also direct airflow away from the workstations, corridor spaces and command control console areas where cooled air is not required or desired. By directing airflow, the system allows data centers to save electricity and costs associated with electricity usage. In some circumstances, installation of the system may lower costs associated with the purchase of one or more CRACs. The present invention provides a system to direct cool airflow under the raised floor to more effectively control the high heat temperature zones within a data center. By increasing efficiency the invention may lower electricity costs. The system may reduce the number of CRAC's required to cool a data center. The system can also be used to partition off areas under workstations, corridor stations and command control console areas where cooled air is not required or desired. The system can also be used to separate hot aisles of air from cold aisles of air. The system provides a solution to airflow distribution problems without major reconstruction of the existing structure and without adding sheet metal ducting within the plenum spaces of data centers. The system is removable and repositionable thereby allowing data center managers increased flexibility in arranging equipment within a data center. The system according to the present invention is constructed of material that is more flexible and easier to work with than sheet metal or ductwork. The cost of labor for installation of the system may also be less expensive than the installation of sheet metal ductwork. It is a feature and advantage of the invention disclosed herein that the baffles can be adapted for use within any plenum, including the plenum of a hung or drop ceiling, and can be mounted to any plenum support structures including but not limited to floor pedestals or ceiling tile framework supports. These and other advantages and features of the present invention will become apparent from the following detailed description in conjunction with the accompanying drawings.

BRIEF DESCRIPTION OF THE DRAWINGS

FIG. 4 is an elevation view of a baffle according to a preferred embodiment of the present invention.

FIG. 10 is a cross section view of a baffle connected to a pedestal in a bypass or straight arrangement.

FIG. 11 is a cross section view of a baffle connected to a pedestal with a baffle in a corner or curved arrangement.

FIG. 12 is a perspective view of a baffle with air blades attached to it.

FIG. 13 is an elevation view of a baffle depicting an alternate embodiment of scored cut features.

FIG. 15 is an elevation view of an alternate embodiment baffle having accordiated pleats.

DETAILED DESCRIPTION OF THE PREFERRED EMBODIMENT

The invention is plenum partition baffle system comprised of lightweight and flexible baffles that may be easily installed interconnected and easily installed upon plenum support structures without destruction attachment to the structures. After installation the baffles may be easily removed from each other and also easily removed from the support structures. In the preferred embodiment the baffles are scored to allow for break-apart sizing and shaping. Due to their break-apart construct the baffles may be sized and shaped with or without tools to allow for intra-plenum installation. The break-apart construct also allows for the passage of cables and building infrastructure through them in form-fitting or near form-fitting manner.

Figure 1:
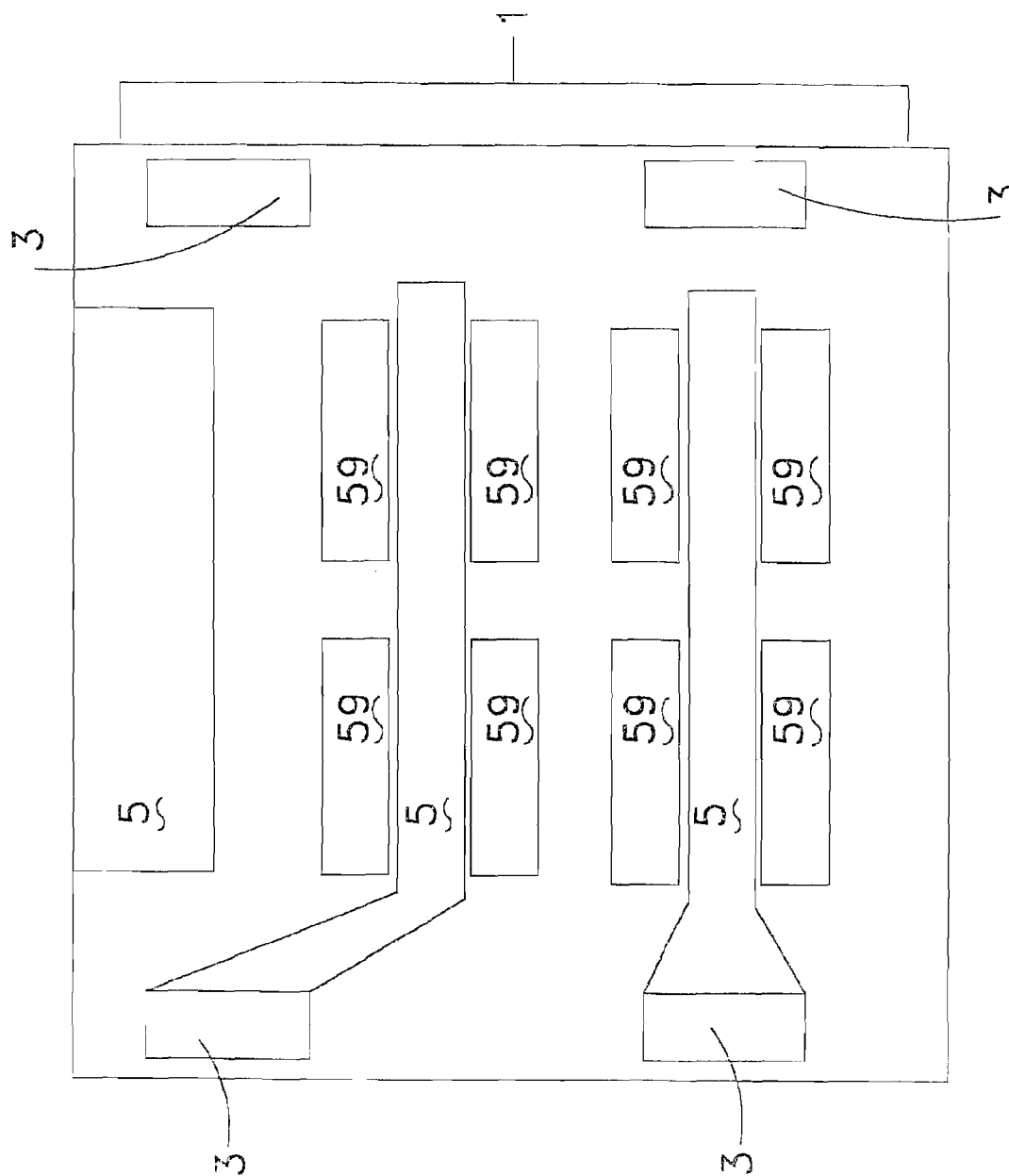
FIG. 1 is a plan view of a data center.
Figure 2:
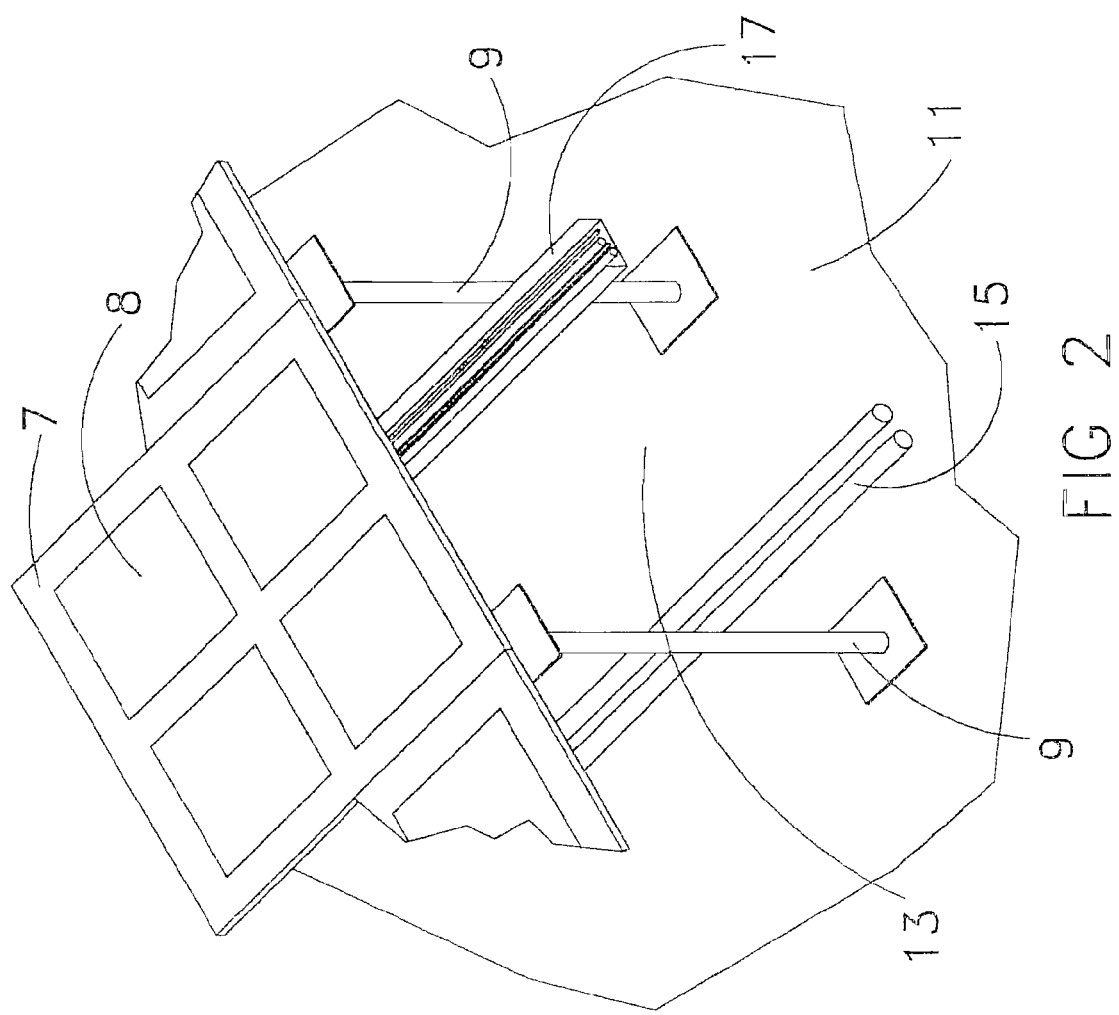
FIG. 2 is a cut-away perspective view of a raised floor arrangement illustrating a typical pedestal supporting floor tiles and further illustrating examples of cable trays and conduits.
Figure 3:
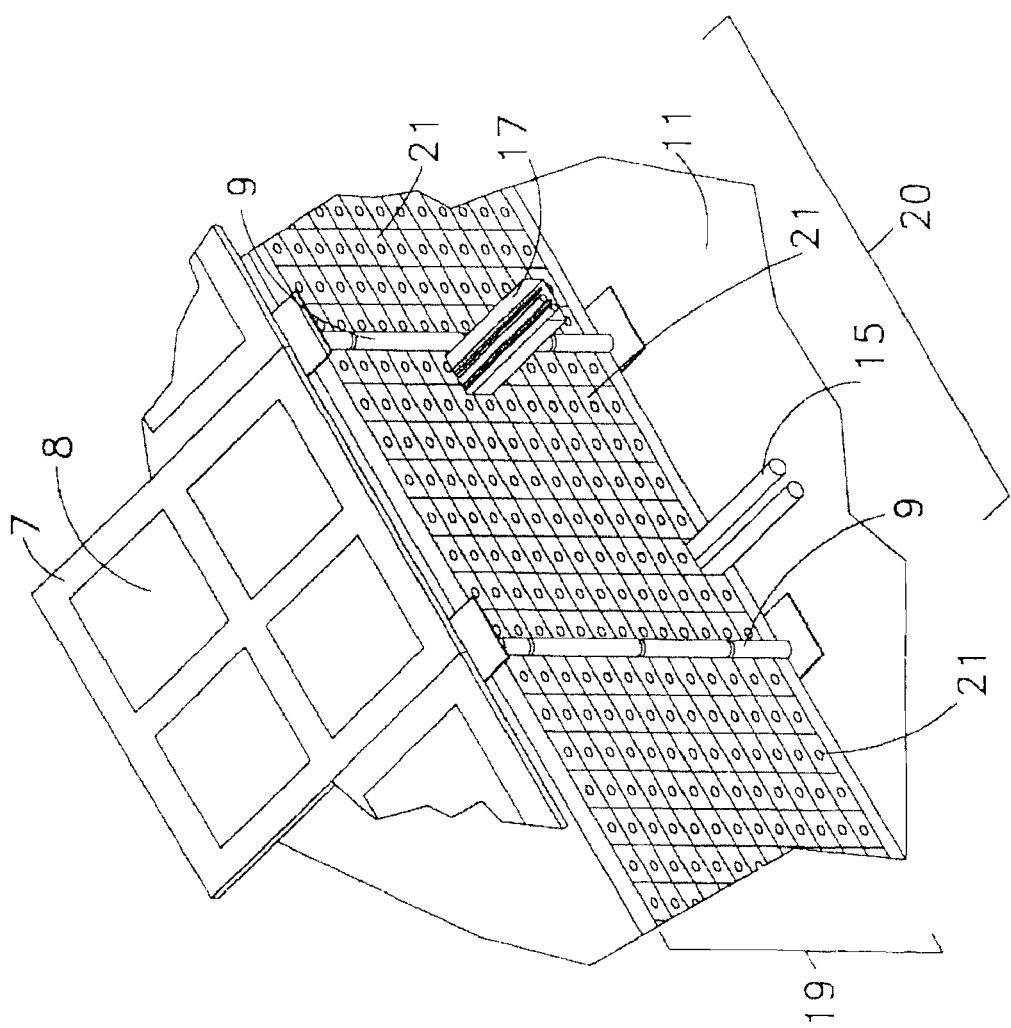
FIG. 3 is a cut-away perspective view of the raised floor arrangement as drawn in FIG. 2 illustrating a preferred embodiment baffle of the present invention installed.

Referring to FIG. 1, there is shown a data center 1. Within the data center 1 are CRACs 3, controlled air zones 5 and equipment racks 59 for servers and other conventional computer and data center equipment. FIG. 2 shows a raised floor 7 of the data center 1. The raised floor 7 of the data center 1 may have floor tiles 8 that are perforated (not shown) to allow air to flow up through the perforated floor tiles 8 into the data center 1. Pedestals 9 extend from sub-floor 11 and support the raised floor 7. Plenum 13 is the space between the raised floor 7 and the sub-floor 11. In a building having a conventional raised floor, cable raceways 15 and cable trays 17 provide support paths for wires and cables running through the plenum 13 and into the equipment within the data center 1. FIG. 3 shows an embodiment of the plenum partition baffle system 19 of the present invention in use within the plenum 13 depicted in FIG. 2.

In operation, the system 19 directs airflow within the plenum 13. System 19 is assembled from individual interconnecting baffles 21. Individual baffles 21 are connected to form an assembly of baffles 20. In the preferred embodiment, the baffles 21 are rectangular in shape, but can be any other shape. In the preferred embodiment, the baffles 21 are made from a flame retardant polypropylene material, such as FORMEX™ GK40. However, baffles 21 may be manufactured from any fire retardant substance that is flexible enough to allow bending around and contouring around pedestals and other intra-plenum structure without breaking.

Figure 4:
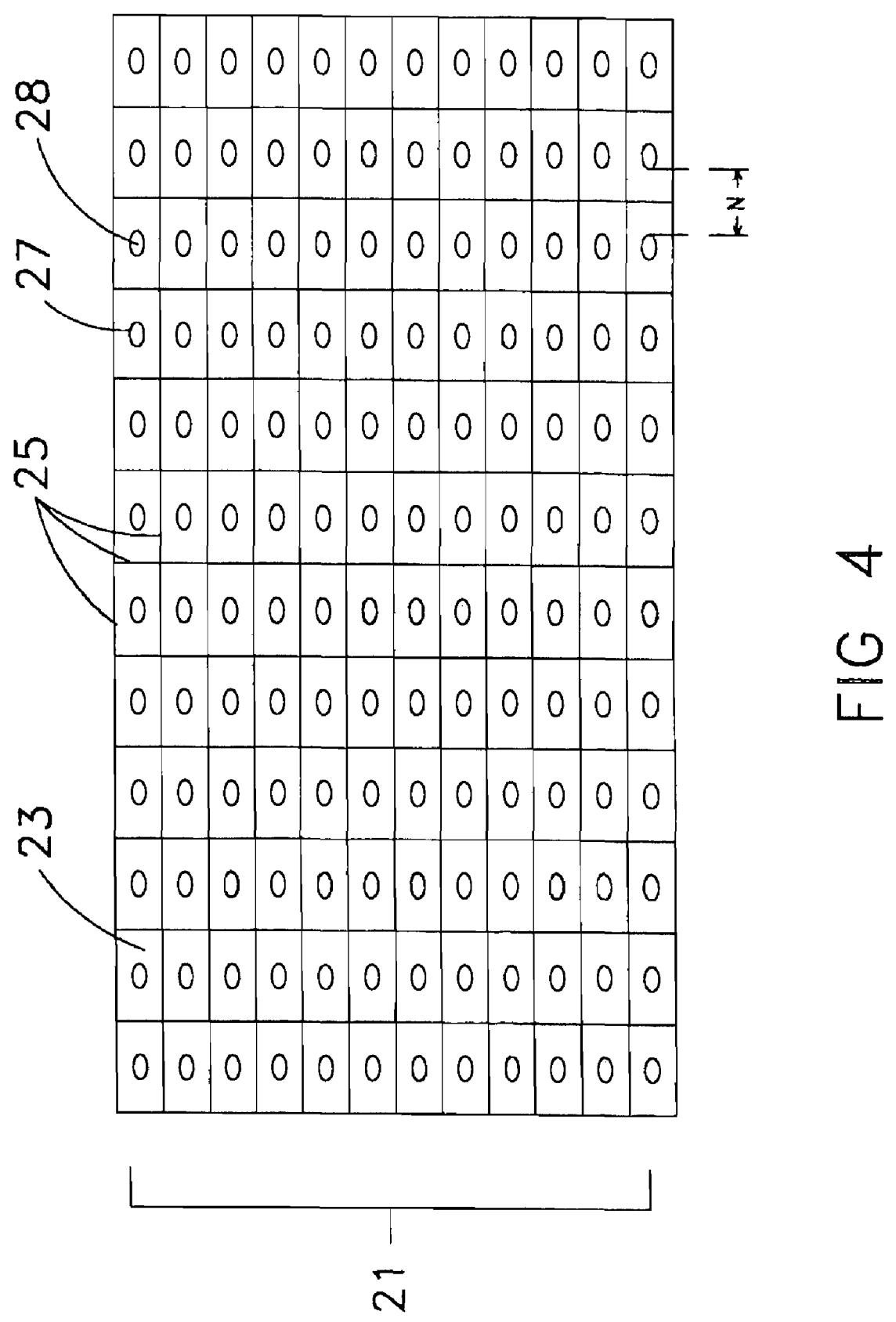
Figure 5:
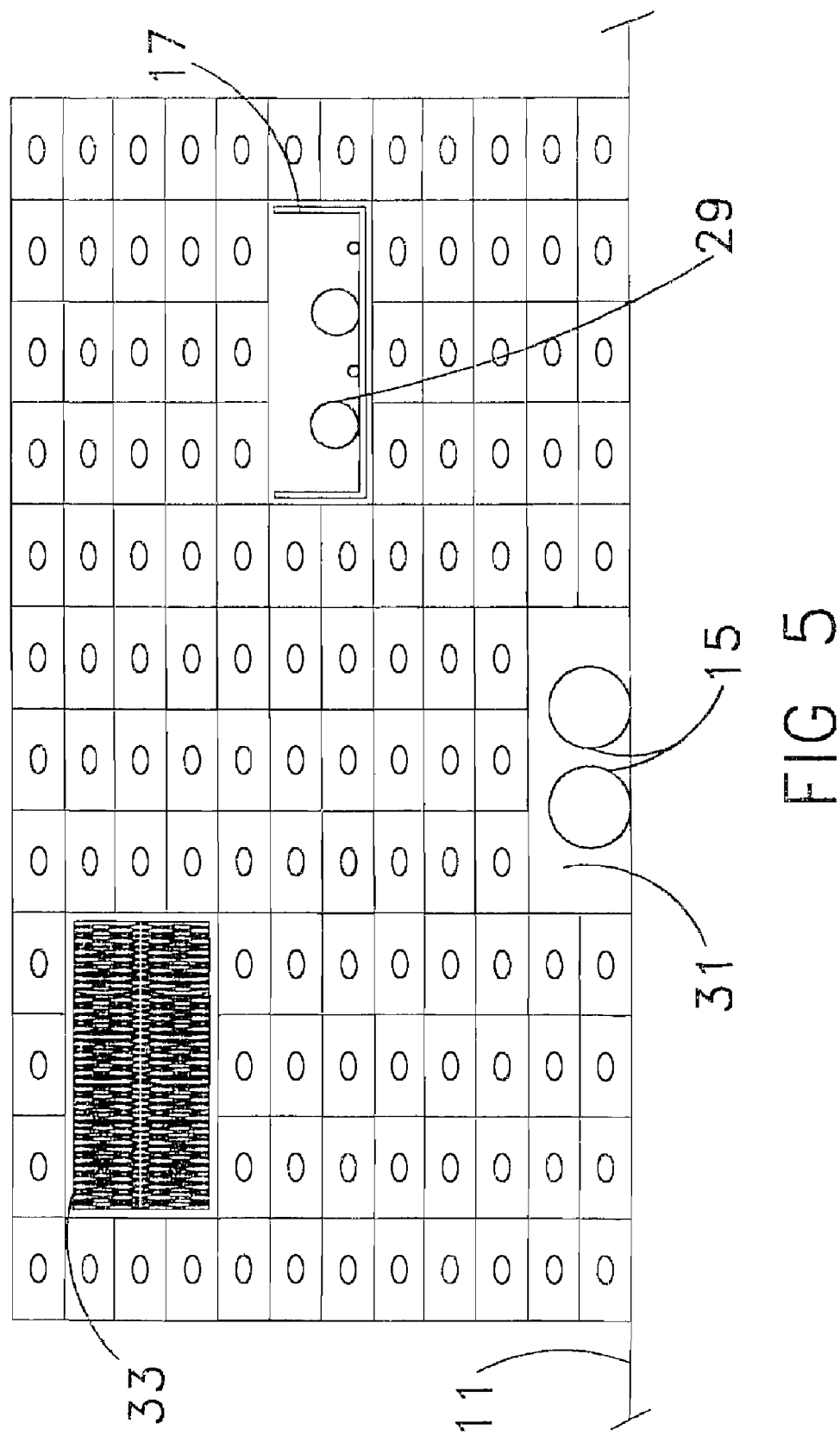
FIG. 5 is an elevation view of a baffle in which a cable tray opening, another opening and a flexible self-sealing dam have been inserted in areas where segments of the baffle have been removed.

As shown in FIG. 4, the preferred embodiment of the baffle 21 includes elemental segments 23 scored into at least one of its surfaces. In the preferred embodiment, the elemental segments 23 are rectangular shaped. The rectangular shape is produced by horizontal and vertical scores 25 which allow changing the baffle 21 to be re-sized or re-shaped by removing a desired number of segments 23 in one or more desired locations. Because of the horizontal and vertical scored lines 25, portions of the baffle 21 may be removed to achieve a more refined system 19, shape or size without use of a tool simply by breaking apart or tearing away segments of the baffle. Segments of a baffle may be removed so as to provide the baffle 21 with one or more defined openings 31 as is shown in FIG. 5. The segments 23 allow portions of the baffle 21 to be removed in order to accommodate cable tray openings 29 or other openings 31. FIG. 5 depicts a baffle with defined openings receiving a cable tray 17 and a flexible self-sealing dam 33 to provide raceways for cables 15 or other equipment. The removed portions of the baffle 21 can be patched or repaired by simply adding a baffle 21 or a portion of a baffle 21 to a specific area of the baffle 21 or system 19.

Figure 8:
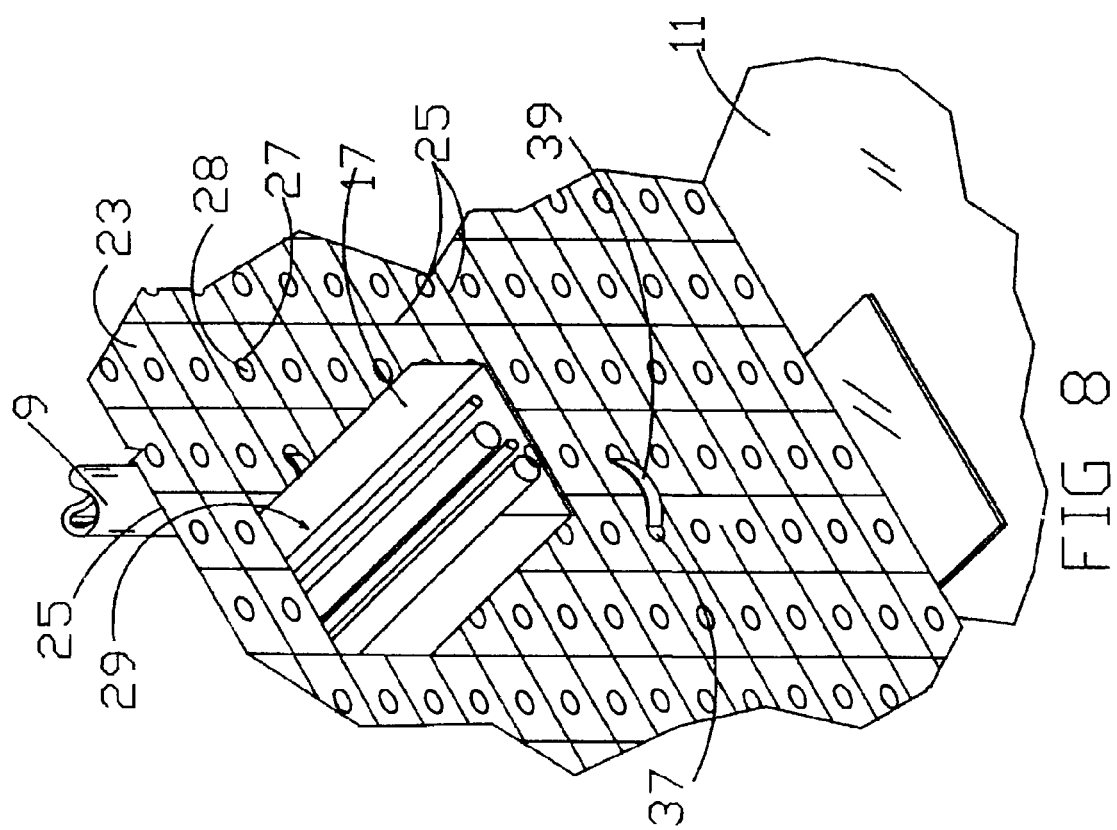
FIG. 8 is a perspective view of a baffle attached to a pedestal.
Figure 9:
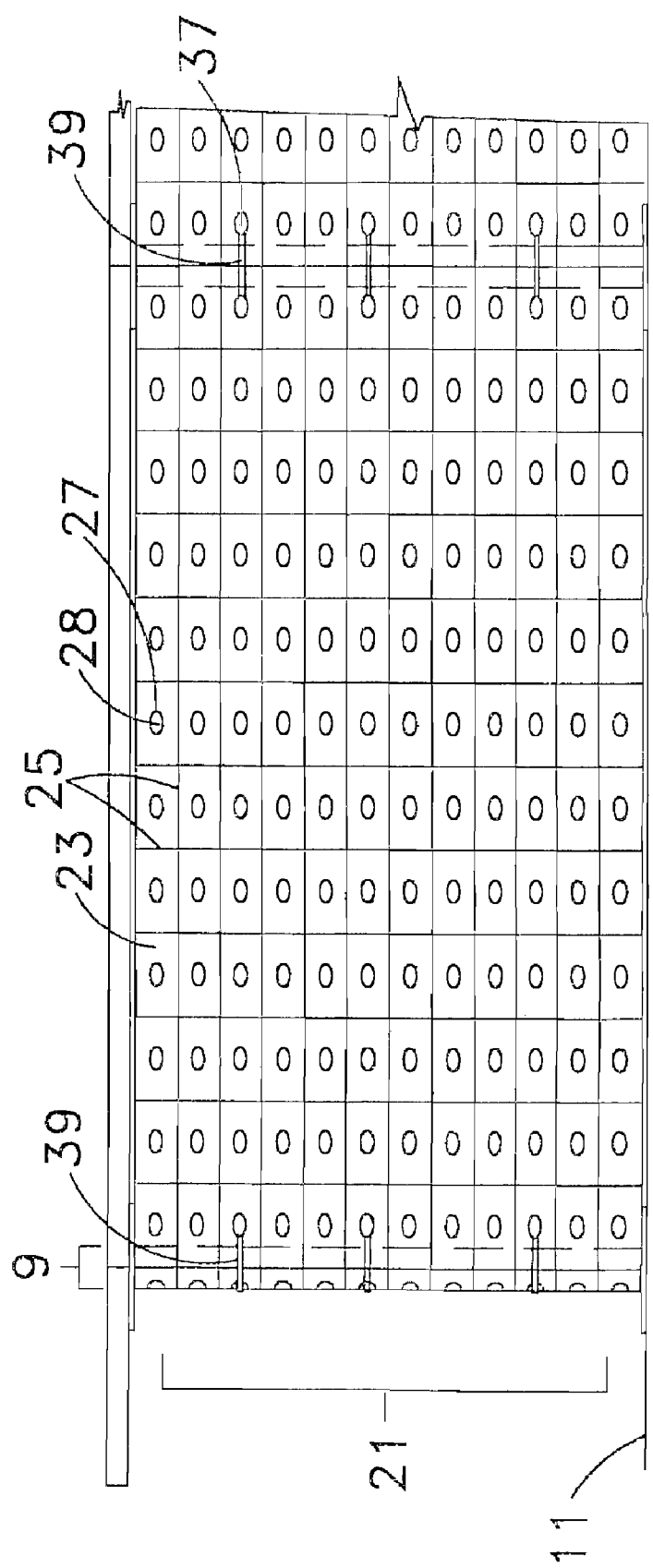
FIG. 9 is an elevation view of a baffle attached to a pedestal.

In a preferred embodiment, each elemental segment 23 has a generally horizontally oriented racetrack or oval shaped scored outline 27 generally centered within it that defines a potential aperture. The inner portion 28 of the scored oval outline is preferably removed (popped out) manually by application of finger pressure to the portion of the baffle within the scored oval outline. Alternatively, the inner portion of the scored oval outline could be removed by using a common pressing or cutting hand tool. As shown in FIGS. 8-9, upon removal of the inner portion 28 a generally horizontally oriented racetrack shaped aperture 37 is formed. As shown in the embodiment of FIG. 4, oval shaped apertures 37 can be arranged in one or more rows whereby adjacent oval shaped aperture outlines are separated by horizontal distance N. In prototype versions of the preferred embodiment baffle system, baffles wherein the distance N between the generally horizontally oriented oval shaped outlines equals one inch were shown to offer overall improved interconnection and pedestal mounting than baffles having a shorter or longer distance N.

Figure 6:
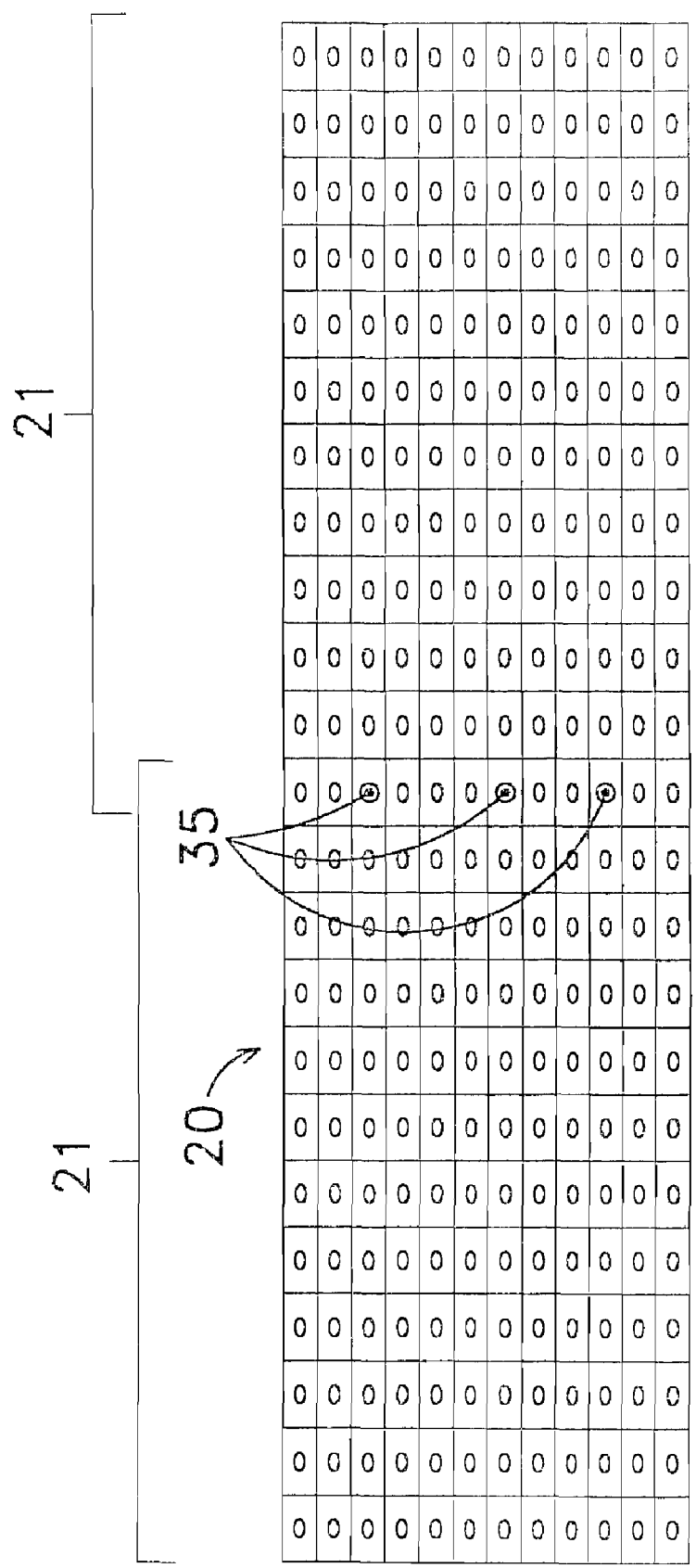
FIG. 6 is an elevation view of two interconnected baffles.
Figure 7:
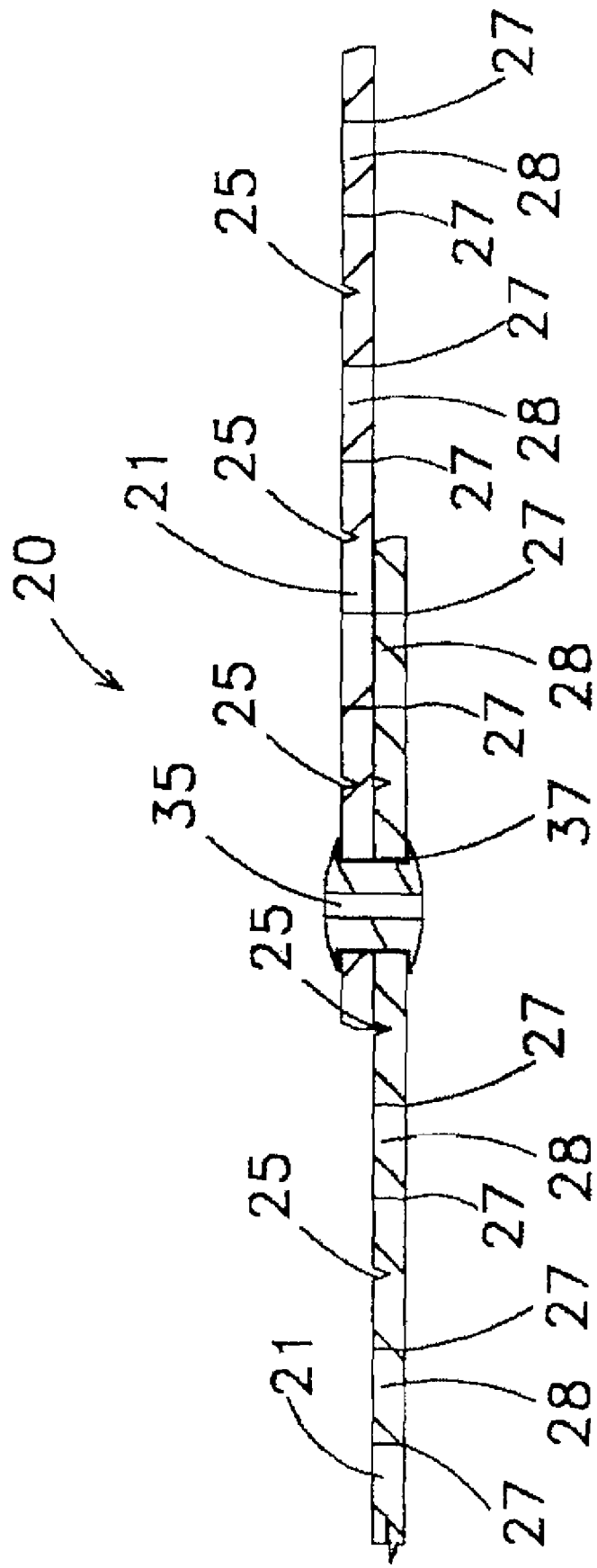
FIG. 7 is an overhead section view depicting how two overlapping baffles may be interconnected using a pass-through attachment device such as a screw or rivet.

In operation, the system 19 directs airflow within the plenum space 13 of a data center 1. The system 19, is made of an assembly of baffles 20. As shown in FIGS. 6-7, the individual baffles 21 are connected to form the assembly of baffles 20. The baffles may be interconnected by overlapping one baffle with another, aligning a fastener-accepting aperture in one baffle with a like aperture of another baffle and inserting a fastener through the aligned apertures. Any type of fasteners, including but not limited to screws, rivets, bolts or threaded posts, can be used to interconnect the baffles. In the depicted embodiment, a rivet 35 that passes through both baffles 21 via the oval shaped aperture 37 connects the baffles 21. A preferred rivet 35 is manufactured by Micro Plastics® Inc. (part number 401009). Because each baffle can be reduced in size and re-shaped and because baffles can be interconnected in horizontal or vertical arrangement, an assembled baffle panel of any needed width or height can be built.

FIGS. 8-9 show the preferred embodiment method of attaching the baffles 21 to the pedestal 9. In the depicted embodiment, baffle 21 is attached to pedestal 9 by means of fastener 39 that loops around the pedestal 9 and through at least two fastener-accepting apertures 37. A preferred embodiment mounting fastener 39 is a Richco, Inc. cable tie (part number QTE-30XL). As shown in FIG. 3, pedestals 9 supporting the raised floor 7 also support the assembly of baffles. The baffles 21 may be connected to a pedestal 9 in such a way so as to allow the baffle to bypass the pedestal or bend around the pedestal to form a corner or angle 40. FIG. 10 is a cross-section view of a baffle mounted to pedestal 9 whereby the baffle connects to the pedestal in a straight or bypass fashion, producing an approximate straight edge 38. FIG. 11 is a cross section view of a baffle 21 mounted to the pedestal 9 whereby the baffle bends around the pedestal forming a corner or angle 40. In the preferred embodiment, the fastener 39 connects the baffle 21 nondestructively to the pedestal 9 by means of a fastener passing through the fastener-accepting apertures 37. It will now be understood that the baffle may be connected or attached to any side or surface of the pedestal 9. It will also be appreciated that the oval shaped apertures of the preferred embodiment in the baffles provide distinct advantages over round, square or other shape apertures. First, because the oval aperture is in the nature of a horizontally oriented slot, a baffle comprised of oval apertures has a certain degree of "play" or side-to-side movement when connecting a baffle to another baffle or a pedestal. Thus, the oval shape feature of the apertures also allow for less precise measuring and shaping of the baffle as compared to a round or square hole when sizing and shaping the baffles for installation. This shape feature of the aperture also protects each baffle, the baffle system and any supporting structures from any forces acting against them due to thermodynamic expansion and contraction. Additionally, should the need arise to bend a baffle along a line including a fastener-accepting aperture, insertion of a fastener through a round or square aperture could be rendered difficult or even impossible by virtue of the deformation (reduction of the surface area) of the aperture due to the bending. However, with an oval aperture, the baffle can be bent along a line including an aperture without rendering the aperture impassable. Hence, the oval shape feature of the aperture allows for insertion of fasteners under conditions where the baffle is flexed or bent. Additionally, by virtue of the fact that the oval apertures do not have any interior corners that could serve as starting points for cracks or tears in the baffle material, the oval apertures are structurally advantageous over polygonal apertures.

The system 19 may be used to partition off a specific area in the plenum 13. It may also be employed to direct airflow to a specific area of the plenum 13 or may direct airflow away from a specific area of the plenum 13. The system 19 can vary in size depending on the size of the data center 1 or the plenum 13. Baffles 21 can be added to the system 19 to achieve the desired height or width. The unique assembly of the invention allows the system 19 to be easily removed and moved and reassembled in another location in the plenum or in another plenum altogether to accommodate data center 1 reconfigurations. This unique assembly allows the system 19 to be increased in size or decreased in size as conditions change or airflow needs change.

Baffles having the grid pattern made up of elemental scored rectangles having generally centered, horizontally oriented scored oval aperture outlines have proven flexibility in intra-plenum installation. However, other patterns may be used as well. FIG. 13 shows another embodiment of a baffle 63 having vertically oriented, elongated scored oval aperture outlines 45. The area of the baffle within each elongated oval scored feature can be removed in pop-out manner, preferably by the application of finger pressure to the area. Alternatively, the area within the elongated oval feature can be removed by using a tool to press or cut the area out. When this area is removed, vertically oriented slots are formed, which allow for greater up and down positioning of the baffle. The embodiment 63 depicted in FIG. 13 also demonstrates that a baffle can be provided with full-length vertical scored lines 47 in the center of the baffle 63.

Figure 14:
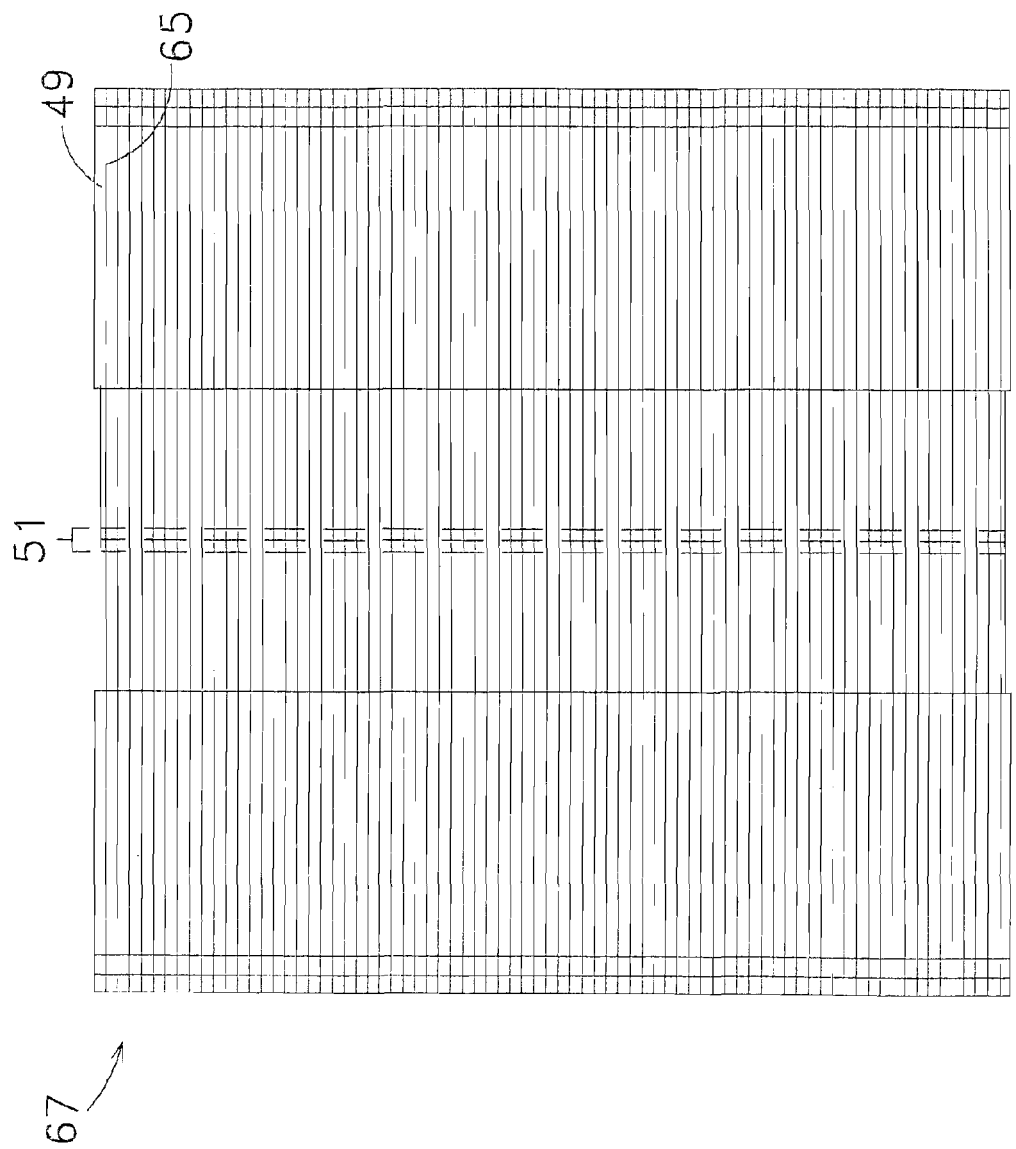
FIG. 14 is an elevation view of an alternate embodiment baffle having accordiated pleats.

FIG. 14 depicts another embodiment baffle 67 having horizontally scored lines 65 that result in horizontal strips 49. The baffles 67 can also be scored vertically 51 in the center of the baffle.

Figure 17:
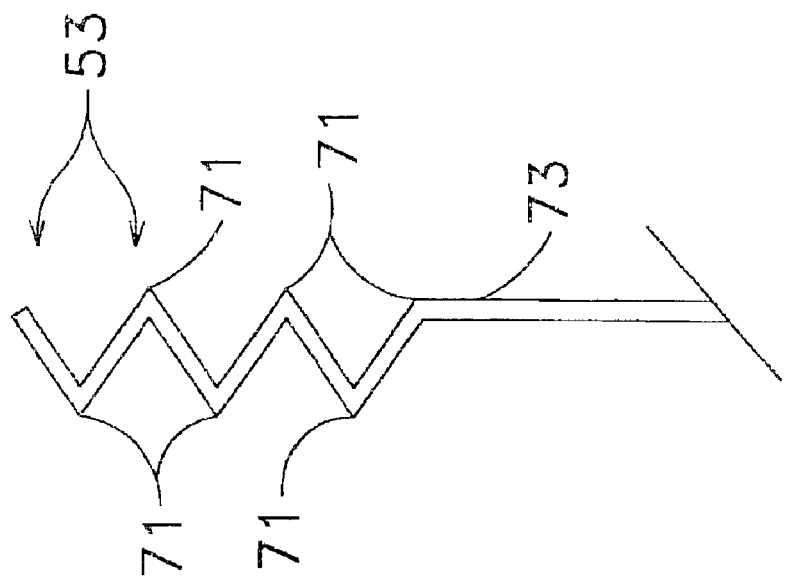
FIG. 17 is a cross section of a baffle drawn in FIG. 15 illustrating an example of the baffle in a compacted state.
Figure 16:
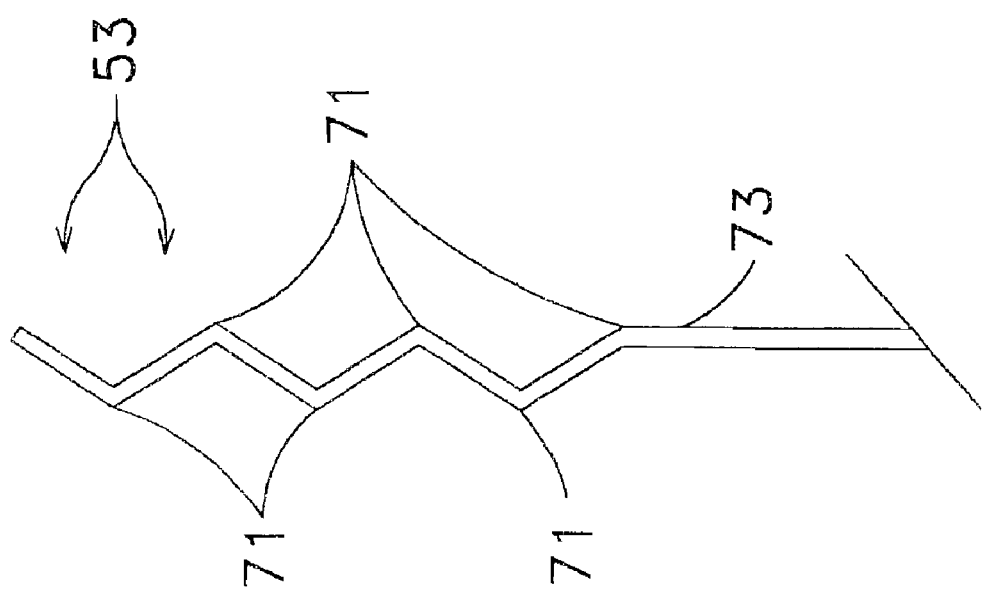
FIG. 16 is a cross section of a baffle drawn in FIG. 15 illustrating an example of the baffle in an extended state.

The system can be adapted to use accordion baffles 69, such as is depicted in FIGS. 15-17. As seen in these figures, this baffle embodiment has accordiated pleats 53 that are connected by vertical scored lines 71. The accordiated pleats 53 may form the entire baffle 69 (not shown) or only part of the baffle 69 as shown in FIG. 15. In FIG. 15, baffle 69 also has an un-accordiated portion 73. FIG. 16 is a cross section view of an accordion baffle 69 illustrating the accordiated pleats 53 in an extended state. FIG. 17 illustrates the accordiated pleats 53 in a compacted state.

FIG. 12 illustrates an embodiment of the invention whereby air blades 43 are mounted to a baffle. The air blades 43 can be utilized with other embodiments of the invention as well. In a preferred embodiment, the air blades 43 illustrated in FIG. 12 can be connected, attached or located in operative association with or to the baffle 21 and in a preferred embodiment the racetrack or oval shaped apertures 37 are located relative to connection tabs 61 and a rivet 35 may be used to hold the connection tab and blade in place relative to the baffle. The air blades 43 help move the airflow in a vertical direction.

Figure 18:
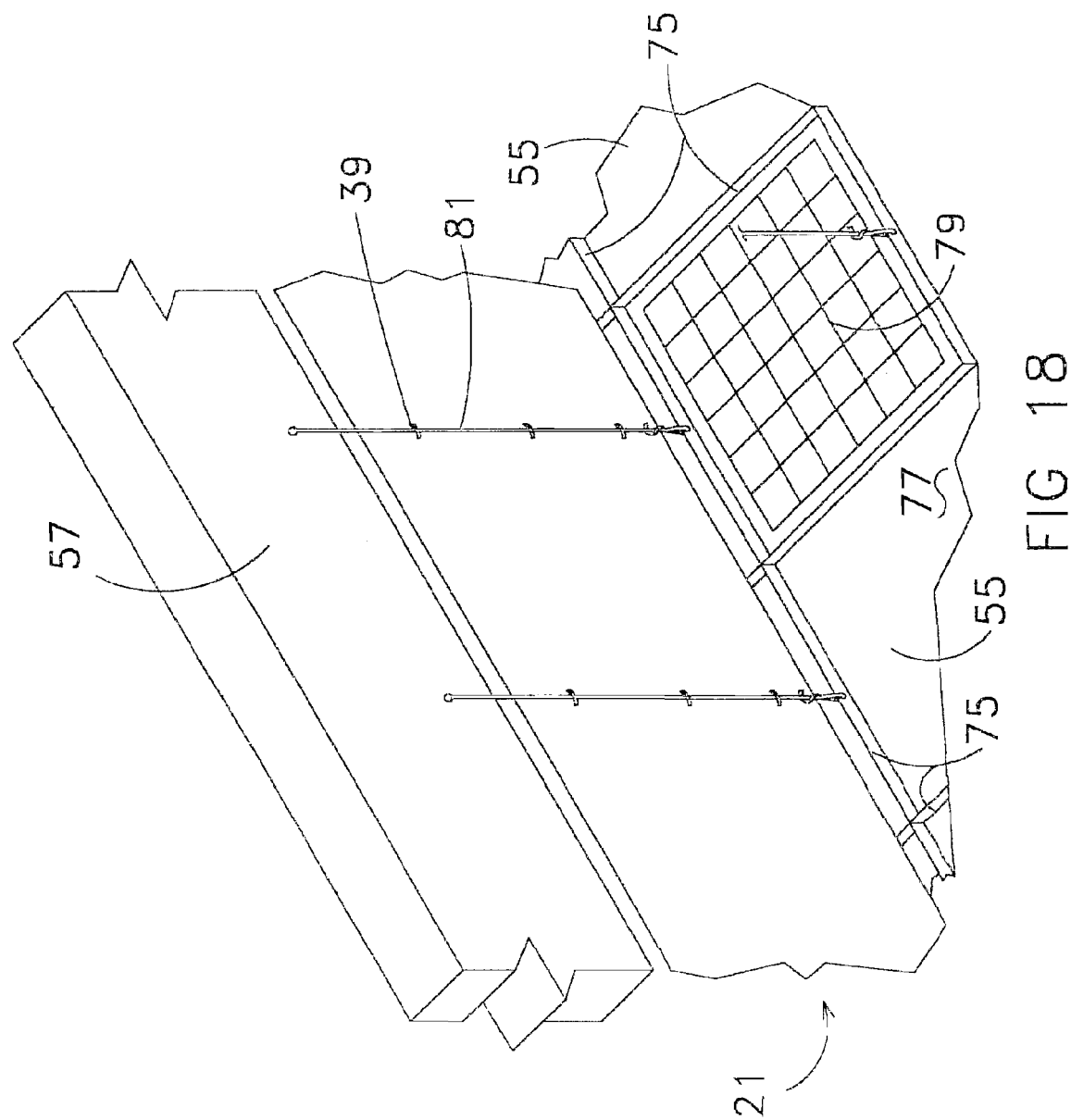
FIG. 18 is a perspective view of a hung ceiling and further illustrating an embodiment of the present invention.

The plenum partition baffle system disclosed herein can be easily adapted for use in the plenum or air handling space in a hung or drop ceiling. This embodiment is shown in FIG. 18. In this embodiment, plenum partition baffle system 19 is located in the plenum created by hung ceiling 55 by using framework supports 81. Fasteners 39 connect the baffles 21 to the framework supports 81. Framework supports 81 connect framework 75 (and thus hung ceiling 55) to building structure 57. Hung ceiling 55 has ceiling tiles 77 which may include vents 79. The ceiling tiles 77 rest in framework 75 (typically arranged in a grid) or other suspended, hung or dropped ceiling support systems.

While specific embodiments have been shown and described, many variations are possible. The particular shape of the segments and scored lines and markings, scoring depths and aperture outlines including all horizontal and vertical orientations, dimensions and thicknesses may be changed as desired to suit the floor or ceiling plenum with which the invention is used. The material and its configuration and number of segments may vary although a preferred embodiment is shown and described, for example, the segments may be interlocking puzzle-piece-like shapes and the baffles may be non-rectangular. In addition, though the invention is representatively described herein for use in a pressurized plenum, the invention is equally adaptable for use in heating or cooling system in which the conditioned air in the plenum is maintained at a zero or negative pressure with respect to workspace air and the conditioned air is delivered to the workspace by means of active (e.g., powered fan) supply outlets. The terms, descriptions and figures used herein are set forth by way of illustration only and are not meant as limitations. Those skilled in the art will recognize that many variations are possible within the scope of the invention, which is intended to be defined by the following claims and their equivalents, in which all terms are meant in their broadest reasonable sense unless otherwise indicated.

What is claimed is:

1. A system for directing airflow, the system comprising:
a sub-floor;
a plurality of raised-floor tiles;
a plurality of pedestals extending between the sub-floor and the raised-floor tiles;
one or more baffles, each baffle comprising a panel having a plurality of horizontal and vertical scored grid lines defining a plurality of segments that can be selectively removed from the panel to alter the size or shape of the panel and one or more scored aperture outlines within each segment, the portions of the baffle within the one or more scored aperture outlines being capable of removal from the baffle by the application of pressure upon those portions and wherein upon removal of a portion of the baffle within a scored aperture outline, a fastener-accepting aperture results; and a plurality of fasteners coupling the one or more baffles to the pedestals via the fastener-acceptinq aperture such that the one or more baffles, the raised-floor tiles, and the sub-floor direct airflow.

2. The system of claim 1 wherein the baffle is sufficiently flexible to flex around a pedestal.

3. The system of claim 1 wherein each scored aperture outline is oval or racetrack shaped.

4. The system of claim 1 wherein the panel comprises flame retardant polypropylene.

5. The system of claim 1 wherein the panel has a substantially flat cross-section.

6. The system of claim 1 wherein the plurality of fasteners are cable ties.

7. The system of claim 1 further comprising a rivet coupling two of the baffles to each other.

8. The system of claim 7 wherein the rivet extends through the fastener-accepting apertures on each baffle for coupling the two baffles to each other.

9. The system of claim 1 wherein the segments are substantially uniform in size.

10. A method of partitioning an underfloor air handling space, the underfloor air handling space having a sub-floor, a plurality of raised-floor tiles, and a plurality of pedestals extending between the sub-floor and the raised-floor tiles for supporting the raised floor tiles, the method comprising:

providing a baffle including a panel having a plurality of horizontal and vertical scores defining a plurality of removable segments, each segment having a scored aperture outline within the segment forming an aperture by removing a portion of the panel within the scored aperture outline; coupling the baffle to one of the pedestals using the aperture;

directing airflow through a space defined by the baffle, the raised floor tiles and the sub-floor.

11. The method of claim 10 wherein forming includes applying pressure to said portion of the panel to remove said portion of the panel.

12. The method of claim 11 wherein forming includes removing said portion of the panel without use of a tool.

13. The method of claim 10 wherein coupling includes coupling the baffle to one of the pedestals using the aperture and a fastener inserted through the aperture.

14. The method of claim 10 further comprising sizing the baffle by selectively removing one or more of the plurality of segments.

15. The system of claim 1 wherein the panel comprises a flame retardant substance.

* * * * *